US008721043B2

(12) United States Patent
Suzuki

(10) Patent No.: US 8,721,043 B2
(45) Date of Patent: May 13, 2014

(54) INK-JET HEAD AND METHOD OF MANUFACTURING THE SAME

(75) Inventor: Isao Suzuki, Shizuoka-ken (JP)

(73) Assignee: Toshiba Tec Kabushiki Kaisha, Tokyo (JP)

( * ) Notice: Subject to any disclaimer, the term of this patent is extended or adjusted under 35 U.S.C. 154(b) by 127 days.

(21) Appl. No.: 13/207,254

(22) Filed: Aug. 10, 2011

(65) Prior Publication Data

US 2012/0038711 A1 Feb. 16, 2012

(30) Foreign Application Priority Data

Aug. 11, 2010 (JP) ................................ 2010-180597

(51) Int. Cl.

*B41J 2/14* (2006.01)
*B41J 2/16* (2006.01)
*B41J 2/045* (2006.01)
*H01L 41/22* (2013.01)
*H04R 17/00* (2006.01)

(52) U.S. Cl.

USPC ............................... 347/47; 347/69; 29/25.35

(58) Field of Classification Search

USPC ........................................................... 347/69

See application file for complete search history.

(56) References Cited

U.S. PATENT DOCUMENTS 5,646,661 A * 7/1997 Asai et al. ....................... 347/69
7,264,343 B2 9/2007 Harvey et al.

FOREIGN PATENT DOCUMENTS

JP 5-074810 10/1993
JP 2003-025570 1/2003
JP 2006-035453 2/2006
JP 2007-230045 9/2007
JP 2009-113501 5/2009
JP 2009-196122 9/2009

OTHER PUBLICATIONS

Office Action filed in Japanese counterpart application No. 2010-180597, mailed on Jul. 16, 2013 (with English translation).

* cited by examiner

*Primary Examiner* — Lisa M Solomon

(74) *Attorney, Agent, or Firm* — Patterson & Sheridan, L.L.P.

(57) ABSTRACT

According to one embodiment, an ink-jet head includes an insulative substrate, a nozzle plate opposed to the insulative substrate, a partition wall disposed between the insulative substrate and the nozzle plate, and including a bottom surface with a first width which is in contact with the insulative substrate, and a top surface with a second width less than the first width, which is in contact with the nozzle plate, and an adhesive which attaches the partition wall and the nozzle plate.

5 Claims, 8 Drawing Sheets

INK-JET HEAD AND METHOD OF MANUFACTURING THE SAME

CROSS-REFERENCE TO RELATED APPLICATIONS

This application is based upon and claims the benefit of priority from Japanese Patent Application No. 2010-180597, filed on Aug. 11, 2010; the entire contents of which are incorporated herein by reference.

FIELD

Embodiments described herein relate generally to an ink-jet head and a method of manufacturing the ink-jet head.

BACKGROUND

As an ink-jet head which discharges ink drops from nozzle holes, there is known such a type of ink-jet head that a nozzle plate, which has nozzle holes, and a piezoelectric member are attached. In this type, when the nozzle plate is attached to the piezoelectric member, there is a concern that an adhesive may flow into nozzle holes. If the adhesive flows into the nozzle holes, the print quality may be adversely affected. For example, the ink-jet head may not be able to discharge ink drops, or the volume or the direction of discharge of the ink drop, which is discharged from the ink-jet head, may become unstable.

In recent years, with a demand for higher fineness, there is a tendency that the interval of nozzle holes becomes shorter. As a result, the position of adhesion between the nozzle plate and the piezoelectric member becomes closer to the nozzle hole, and the adhesive, which protrudes from between the nozzle plate and the piezoelectric member may easily flow into the nozzle hole.

DETAILED DESCRIPTION

Figure 1:
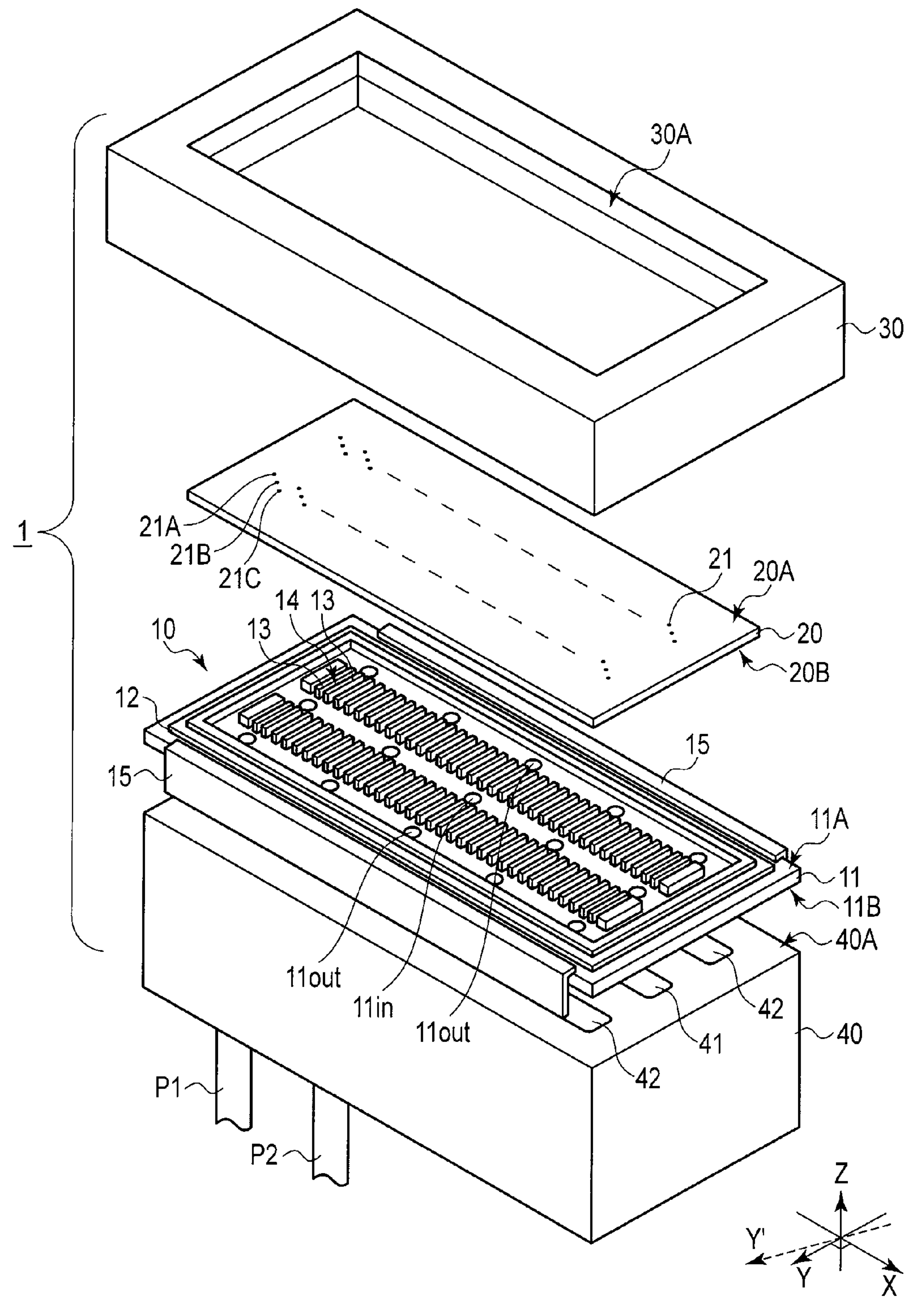
FIG. 1 is an exploded perspective view which schematically shows the structure of an ink-jet head in an embodiment.

In general, according to one embodiment, an ink-jet head includes an insulative substrate; a nozzle plate opposed to the insulative substrate; a partition wall disposed between the insulative substrate and the nozzle plate, and including a bottom surface with a first width which is in contact with the insulative substrate, and a top surface with a second width less than the first width, which is in contact with the nozzle plate; and an adhesive which attaches the partition wall and the nozzle plate.

According to another embodiment, a method of manufacturing an ink-jet head, includes forming a multilayer body of a first piezoelectric member and a second piezoelectric member each having a strip shape extending in a first direction, above an insulative substrate; forming, in the multilayer body, grooves extending in a second direction crossing the first direction, and forming between the grooves a partition wall including a bottom surface with a first width and a top surface with a second width less than the first width; and attaching the top surface of the partition wall and the nozzle plate by an adhesive.

The embodiment will now be described in detail with reference to the accompanying drawing. In the drawings, structural elements having the same or similar functions are denoted by like reference numerals, and an overlapping description thereof is omitted.

FIG. 1 is an exploded perspective view which schematically shows the structure of an ink-jet head 1 in the embodiment.

The ink-jet head 1 includes a main module 10, a nozzle plate 20, a mask plate 30 and a holder 40. The main module 10 includes an insulative substrate 11, a frame body 12 and actuators 13.

The insulative substrate 11 is formed of ceramics such as alumina. The insulative substrate 11 has a rectangular plate shape extending in an X direction that is a first direction. To be more specific, the shape of the insulative substrate 11 is a rectangular shape having a long side along the X direction and a short side along a Y direction which is perpendicular to the X direction. The insulative substrate 11 has a top surface 11A on a side facing the nozzle plate 20, and a back surface 11B on a side facing the holder 40. The insulative substrate 11 includes ink supply ports 11in and ink exhaust ports 11out. The ink supply ports 11in and ink exhaust ports 11out penetrate from the top surface 11A to the back surface 11B.

The frame body 12 is formed of, e.g. ceramics. The frame body 12 has a rectangular frame shape. The frame body 12 is disposed on the top surface 11A of the insulative substrate 11. The actuators 13 are disposed in an inside area surrounded by the frame body 12 on the top surface 11A of the insulative substrate 11. Each of the actuators 13 extends in a Y' direction that is a second direction, which crosses the X direction. The Y' direction is, for example, a direction which is different from the Y direction that is perpendicular to the X direction. The Y' direction is inclined to the Y direction by several degrees, for instance, 1° to 2°. The actuators 13 are arranged in the X direction. Ink pressure chambers 14 each having a groove shape extending in the Y' direction are formed between the actuators 13 that are arranged in the X direction.

In the example illustrated, the actuators 13 are arranged in two rows in the X direction. The ink supply ports 11in are arranged in the X direction at a substantially central part of the insulative substrate 11, that is, between the two rows of actuators 13. The ink exhaust ports 11out are arranged in the X direction at peripheral parts of the insulative substrate 11, that is, between the frame body 12 and the actuators 13. By this structure, ink is supplied from the ink supply ports 11in to the ink pressure chambers 14, and the ink, which passes through the ink pressure chambers 14, is exhausted from the ink exhaust ports 11out.

The nozzle plate 20 is formed of, for example, polyimide (PI). The nozzle plate 20 has a rectangular plate shape extending in the X direction. The nozzle plate 20 is disposed above the main module 10 along a Z direction which is perpendicular to the X direction and Y direction. In other words, the nozzle plate 20 faces the insulative substrate 11. The nozzle plate 20 has a top surface 20A on a side facing the mask plate 30, and a back surface 20B on a side facing the main module 10. The back surface 20B of the nozzle plate 20 is attached to the frame body 12 and actuators 13 by an adhesive.

The nozzle plate 20 has nozzle holes 21. Each nozzle hole 21 faces the ink pressure chamber 14, and communicates with the ink pressure chamber 14. In the example illustrated, the mutually neighboring nozzle holes 21 are not formed on a straight line along the X direction. In this example, three nozzle holes 21A, 21B and 21C are formed with a gradual displacement in the Y direction. Specifically, every third nozzle hole 21 of the arranged nozzle holes 21 is formed on a straight line along the X direction.

The mask plate 30 is formed of, for example, a metal. The mask plate 30 has a frame shape surrounding the nozzle plate 20. The mask plate 30 is disposed above the main module 10 along the Z direction. The mask plate 30 includes a substantially rectangular opening portion 30A which substantially corresponds to the outer size of the nozzle plate 20. The mask plate 30 and the frame body 12 are attached by an adhesive.

The holder 40 is disposed under the main module 10 along the Z direction. The holder 40 includes an ink introducing path 41 for introducing ink into the ink supply ports 11in, and ink recovery paths 42 for recovering the ink which is exhausted from the ink exhaust ports 11out. An introducing pipe P1 is connected to the ink introducing path 41. The introducing pipe P1 introduces ink from an ink tank to the ink introducing path 41. A recovery pipe P2 is connected to the ink recovery paths 42. The recovery pipe P2 recovers ink from the ink recovery paths 42 into the ink tank. The holder 40 has a top surface 40A on a side facing the main module 10. The top surface 40A of the holder 40 and the back surface 11B of the insulative substrate 11 are attached by an adhesive.

On the top surface 11A of the insulative substrate 11, terminals, which are electrically connected to the actuators 13, are disposed on the outside of the frame body 12, and a wiring board 15 is mounted via an anisotropic electrically conductive film. Pulse signals, which are necessary for driving the actuators 13, are applied to the actuators 13 via the wiring board 15. The pulse signals vary the capacities of the ink pressure chambers 14, and include driving pulse signals for discharging ink drops from the nozzle holes 21, and dummy pulse signals which do not discharge ink drops from the nozzle holes 21.

A thermosetting resin, such as epoxy resin, is usable, for example, as the adhesive which attaches the holder 40 and insulative substrate 11, the adhesive which attaches the nozzle plate 20 to the frame body 12 and actuators 13, and the adhesive which attaches the mask plate 30 and frame body 12.

Figure 2:
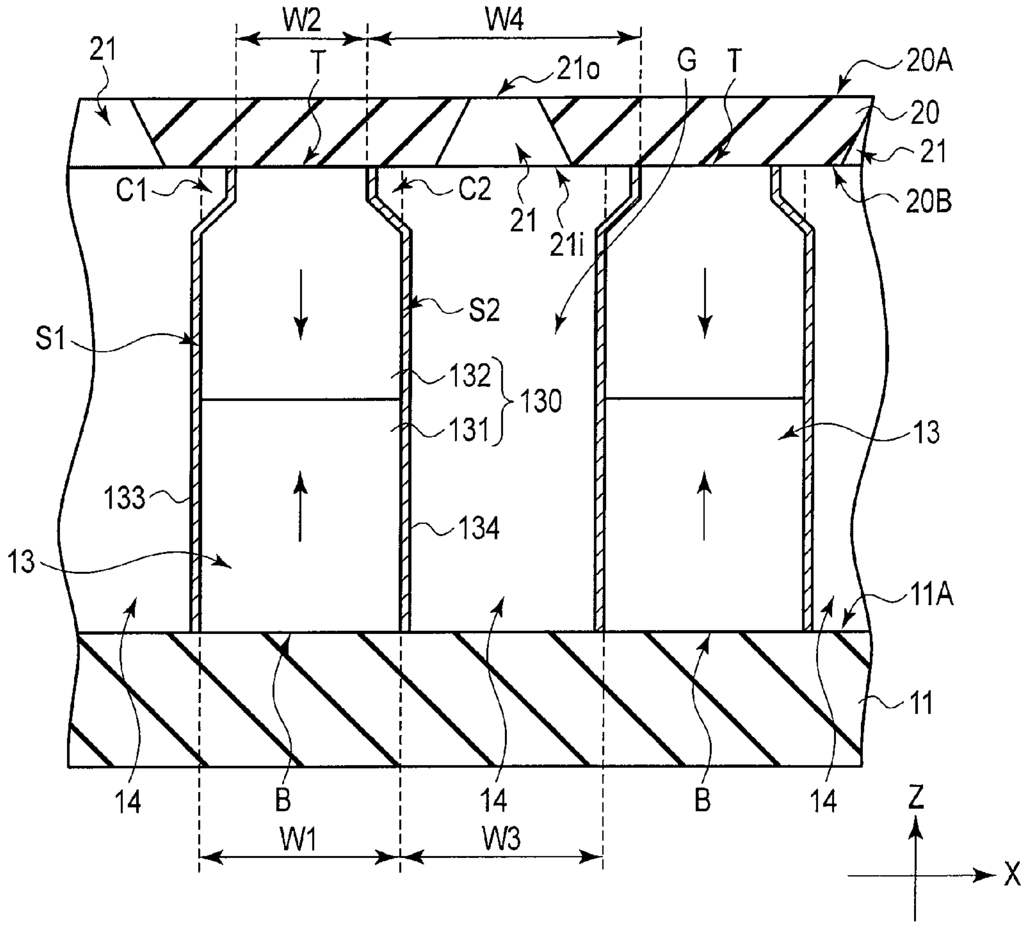
FIG. 2 is a cross-sectional view which schematically shows an actuator which constitutes the ink-jet head.

FIG. 2 is a cross-sectional view which schematically shows the actuators 13 which constitute the ink-jet head 1 shown in FIG. 1. FIG. 2 shows a cross section of the ink-jet head 1 in an X-Z plane.

The actuator 13 includes a first piezoelectric member 131 and a second piezoelectric member 132, which form a partition wall 130, and also includes a first electrode 133 and a second electrode 134. Two actuators 13, which neighbor in the X direction, are arranged with an interval. The two actuators 13 form an ink pressure chamber 14 therebetween. Specifically, a plurality of partition walls 130 (or actuators 13) are disposed between the insulative substrate 11 and the nozzle plate 20, with ink pressure chambers 14 being interposed between the partition walls 130. The ink pressure chamber 14 corresponds to a part of a groove G which is formed between two partition walls 130 which neighbor in the X direction.

The partition wall 130 includes a bottom surface B which is in contact with the insulative substrate 11, a top surface T which is in contact with the nozzle plate 20, a first side surface S1 and a second side surface S2 which face the ink pressure chambers 14, a first recess portion C1 which connects the top surface T and the first side surface S1, and a second recess portion C2 which connects the top surface T and the second side surface S2. The bottom surface B and the first side surface S1 are substantially perpendicular to each other. The bottom surface B and the second side surface S2 are substantially perpendicular to each other. The bottom surface B has a first width W1 in the X direction. The top surface T has a second width W2 in the X direction, which is less than the first width W1.

The first piezoelectric member 131 and second piezoelectric member 132, which form the partition wall 130, are formed of, e.g. PZT (lead zirconate titanate). The first piezoelectric member 131 and second piezoelectric member 132 are stacked in the Z direction. Specifically, the first piezoelectric member 131 is disposed on the top surface 11A of the insulative substrate 11. The second piezoelectric member 132 is attached on the first piezoelectric member 131. As indicated by arrows in FIG. 2, the polarization direction of the first piezoelectric member 131 and the polarization direction of the second piezoelectric member 132 are opposite to each other.

The bottom surface B of the partition wall 130 corresponds to the bottom surface of the first piezoelectric member 131. The top surface T of the partition wall 130 corresponds to the top surface of the second piezoelectric member 132. The first side surface S1 and second side surface S2 of the partition wall 130 include side surfaces of the first piezoelectric member 131 and second piezoelectric member 132. The first recess portion C1 and second recess portion C2 of the partition wall 130 correspond to recess portions of the second piezoelectric member 132.

The first electrode 133 and second electrode 134 are formed by, for example, nickel plating or copper plating. The first electrode 133 covers the first side surface S1 and first recess portion C1 of the partition wall 130. The second electrode 134 covers the second side surface S2 and second recess portion C2 of the partition wall 130. Specifically, the first electrode 133 and second electrode 134 are positioned in a manner to sandwich the partition wall 130.

In the actuator 13 with this structure, when voltages of opposite polarities are applied to the first electrode 133 and second electrode 134, the partition wall 130 comprising the first piezoelectric member 131 and second piezoelectric member 132 deforms. The capacity of the ink pressure chamber 14 varies in accordance with the deformation of the partition wall 130. In other words, the capacity of the ink pressure chamber 14 expands or contracts.

The nozzle plate 20 is attached to the top surface T of the partition wall 130 by an adhesive. The nozzle hole 21 of the nozzle plate 20 communicates with the ink pressure chamber 14. The center of the nozzle hole 21 is located at a substantially middle point between the neighboring partition walls 130. The nozzle hole 21 has an outer diameter 210 at a position on the top surface 20A side of the nozzle plate 20, and an inner diameter 21*i* at a position on the back surface 20B side of the nozzle plate 20. The outer diameter 21*o* is less than the inner diameter 21*i*.

Examples of the dimensions of the respective parts are as follows. Between the neighboring ink pressure chambers 14, the bottom surface B of the partition wall 130 has a first width W1 of 89 μm, and the top surface T of the partition wall 130 has a second width W2 which is less than 89 μm. In the groove G that is formed between the neighboring partition walls 130, a third width W3 of 80 μm is set between the bottom surfaces B of the partition walls 130, a fourth width W4, which is greater than the third width W3, is set between the top surfaces T of the partition walls 130, and the inner diameter 21*i* of the nozzle hole 21 is 50 μm.

Other examples of the dimensions in the case of high fineness are as follows. The bottom surface B of the partition wall 130 has a first width W1 of 45 μm, and the top surface T of the partition wall 130 has a second width W2 which is less than 45 μm. In the groove G that is formed between the neighboring partition walls 130, a third width W3 of 40 μm is set between the bottom surfaces B of the partition walls 130, a fourth width W4, which is greater than the third width W3, is set between the top surfaces T of the partition walls 130, and the inner diameter 21*i* of the nozzle hole 21 is 35 μm.

In the present embodiment, the "width" refers to the length in the X direction in the X-Z plane.

Figure 3:
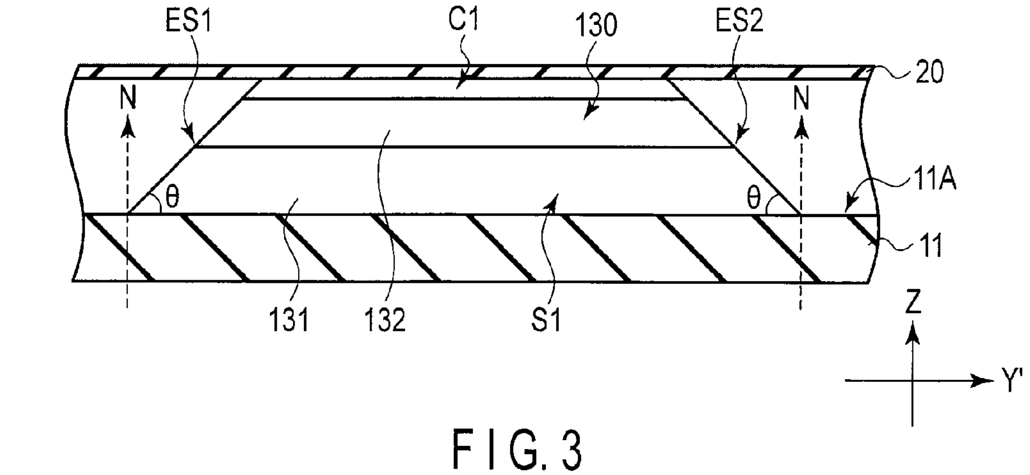
FIG. 3 is a side view which schematically shows the actuator.

FIG. 3 is a side view which schematically shows the actuator 13 shown in FIG. 2. FIG. 3 illustrates the side of the first side surface S1 of the actuator 13 in the Y-Z plane.

The cross-sectional shape of the partition wall 130 is a taper shape tapering from the insulative substrate 11 toward the nozzle plate 20. Specifically, both end surfaces ES1 and ES2 of the partition wall 130 are inclined to a normal line N of the insulative substrate 11. Each of angles θ between both end surface ES1 and ES2 and the top surface 11A of the insulative substrate 11 is an acute angle, for example, 45°.

Figure 4:
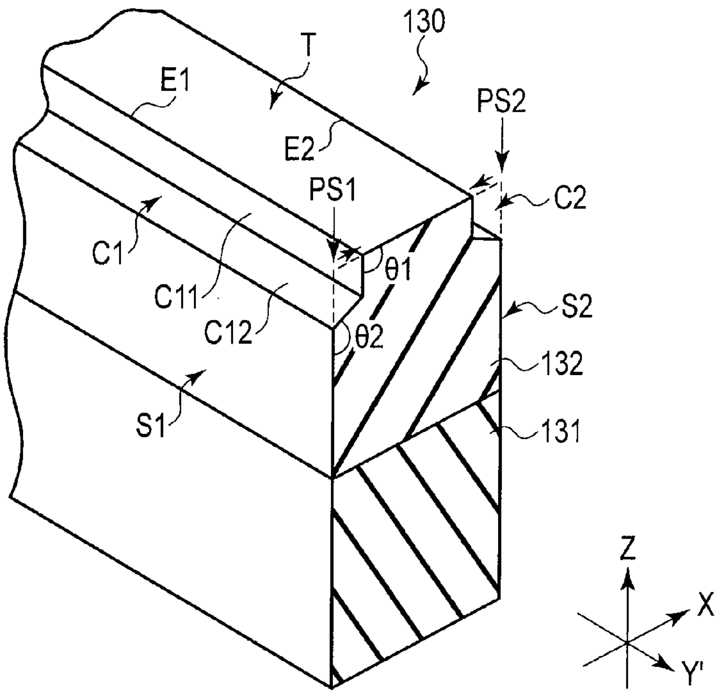
FIG. 4 is a perspective view including a partial cross-sectional view, which schematically shows a structure example of a partition wall which constitutes the actuator.

FIG. 4 is a perspective view including a partial cross-sectional view, which schematically shows a structure example of the partition wall 130 which constitutes the actuator 13 shown in FIG. 2.

In the partition wall 130, a first recess portion C1, which connects the top surface T and the first side surface S1, and a second recess portion C2, which connects the top surface T and the second side surface S2, extend in the Y' direction. A first edge E1 of the top surface T, which is continuous with the first recess portion C1, is located inside a position PS1 which is immediately above the first side surface S1. In addition, a second edge E2 of the top surface T, which is continuous with the second recess portion C2, is located inside a position PS2 which is immediately above the second side surface S2.

The width of the first recess portion C1, that is, the length in the X direction between the position PS1 and the first edge E1, is substantially equal to the width of the second recess portion C2, that is, the length in the X direction between the position PS2 and the second edge E2. Each of the width of the first recess portion C1 and the width of the second recess portion C2 is less than the second width W2 of the top surface T, and is, for example, 10 μm.

In the example illustrated, each of the first recess portion C1 and second recess portion C2 is defined by two flat surfaces. The shape of the first recess portion C1 alone is described here in detail. A detailed description of the shape of the second recess portion C2 is omitted since this shape is the same as the shape of the first recess portion C1. The partition wall 130 includes a first flat surface C11 which is continuous with the top surface T, and a second flat surface C12 which connects the first flat surface C11 and the first side surface S1, thereby to define the first recess portion C1. The first flat surface C11 and second flat surface C12 extend in the Y' direction. An angle θ1 between the top surface T and the first flat surface C11 is 90° (i.e. the top surface T and first flat surface C11 are perpendicular to each other) or an obtuse angle. An angle θ2 between the first side surface S1 and the second flat surface C12 is 90° (i.e. the first side surface S1 and the second flat surface C12 are perpendicular to each other) or an obtuse angle.

Figure 5:
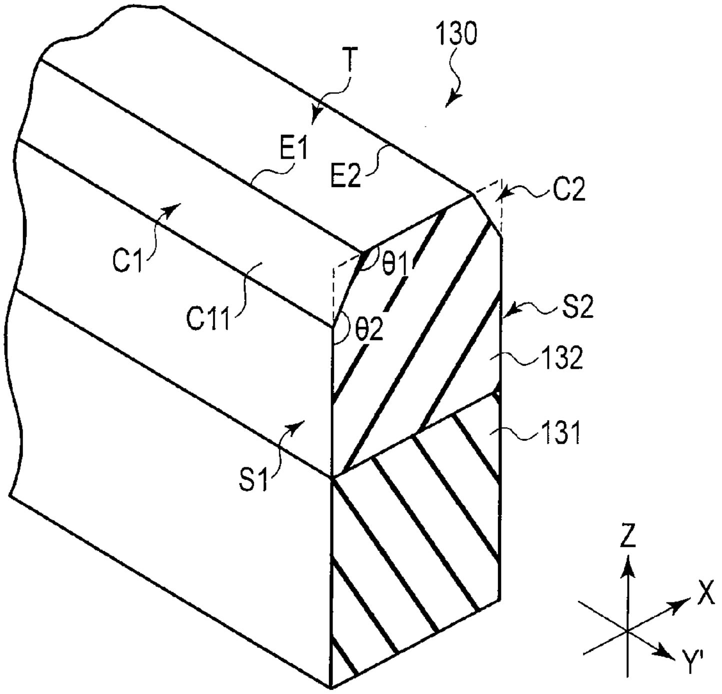
FIG. 5 is a perspective view including a partial cross-sectional view, which schematically shows another structure example of the partition wall which constitutes the actuator.

FIG. 5 is a perspective view including a partial cross-sectional view, which schematically shows another structure example of the partition wall 130 which constitutes the actuator 13 shown in FIG. 2. The structural parts common to those shown in FIG. 4 are denoted by like reference numerals, and a detailed description thereof is omitted.

The example shown in FIG. 5 differs from the example shown in FIG. 4 in that each of the first recess portion C1 and second recess portion C2 is defined by one flat surface. The shape of the first recess portion C1 alone is described here in detail. A detailed description of the shape of the second recess portion C2 is omitted since this shape is the same as the shape of the first recess portion C1. The partition wall 130 includes a single flat surface C11 which connects the first side surface S1 and the top surface T, thereby to define the first recess portion C1. The flat surface C11 extends in the Y' direction. Each of an angle θ1 between the top surface T and the flat surface C11 and an angle θ2 between the first side surface S1 and the flat surface C11 is an obtuse angle.

Figure 6:
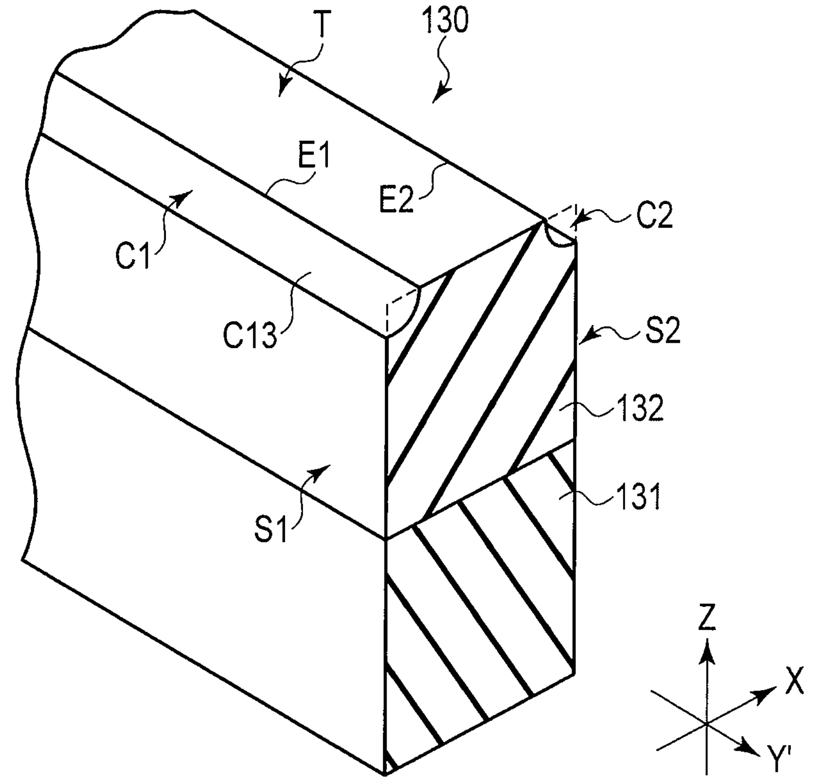
FIG. 6 is a perspective view including a partial cross-sectional view, which schematically shows still another structure example of the partition wall which constitutes the actuator.

FIG. 6 is a perspective view including a partial cross-sectional view, which schematically shows another structure example of the partition wall 130 which constitutes the actuator 13 shown in FIG. 2. The structural parts common to those shown in FIG. 4 are denoted by like reference numerals, and a detailed description thereof is omitted.

The example shown in FIG. 6 differs from the example shown in FIG. 4 in that each of the first recess portion C1 and second recess portion C2 is defined by one curved surface. The shape of the first recess portion C1 alone is described here in detail. A detailed description of the shape of the second recess portion C2 is omitted since this shape is the same as the shape of the first recess portion C1. The partition wall 130 includes a single curved surface C13 which connects the first side surface S1 and the top surface T, thereby to define the first recess portion C1. The curved surface C13 has an arcuate or parabolic cross section in the X-Z plane, and extends in the Y' direction.

As has been described above, in the present embodiment, in order to define each of the first recess portion C1 and second recess portion C2, the partition wall 130 includes one or more flat surfaces or a curved surface.

According to the present embodiment with the above-described structure, when the partition wall 130 and the nozzle plate 20 are attached, a space, which can receive a part of the adhesive for attaching the partition wall 130 and nozzle plate 20, can be formed by decreasing the width of the top surface T of the partition wall 130. To be more specific, the first recess portion C1, which connects the first side surface S1 of the partition wall 130 and the top surface T, and the second recess portion C2, which connects the second side surface S2 and the top surface T, form spaces between themselves and the back surface 20B of the nozzle plate 20.

Thus, even if a part of the adhesive for attaching the partition wall 130 and the nozzle plate 20 protrudes from between the top surface T of the partition wall 130 and the back surface 20B of the nozzle plate 20, the first recess portion C1 and second recess portion C2 receive the protruded adhesive. In the meantime, the first electrode 133 covers the first recess portion C1, and the second electrode 134 covers the second recess portion C2. Thus, the protruded adhesive is received on the first electrode 133 that covers the first recess portion C1, and on the second electrode 134 that covers the second recess portion C2. Thereby, it is possible to prevent the protruded part of the adhesive from flowing into the nozzle hole 21.

In addition, the first edge E1 of the top surface T, which is continuous with the first recess portion C1, is located inside the position PS1 which is immediately above the first side surface S1, and the second edge E2 of the top surface T, which is continuous with the second recess portion C2, is located inside the position PS2 which is immediately above the second side surface S2. Thus, even if the interval of the nozzle holes 21 becomes shorter with the increase in fineness, it is possible to secure a distance from the position of adhesion between the partition wall 130 and the nozzle plate 20 to the nozzle hole 21. Specifically, even if a part of the adhesive protrudes from the first edge E1 and second edge E2 which correspond to the end portions of the position of adhesion, the protruded adhesive flows in the first recess portion C1 and second recess portion C2 before reaching the nozzle hole 21, and thereby it is possible to prevent the adhesive from flowing into the nozzle hole 21.

Therefore, it is possible to realize an increase in fineness, to prevent the occurrence of a problem at a time of printing due to the flow of adhesive into the nozzle hole 21, and to perform printing with high quality.

Next, a description is given of the method of manufacturing the ink-jet head 1 in the embodiment.

Figure 7:
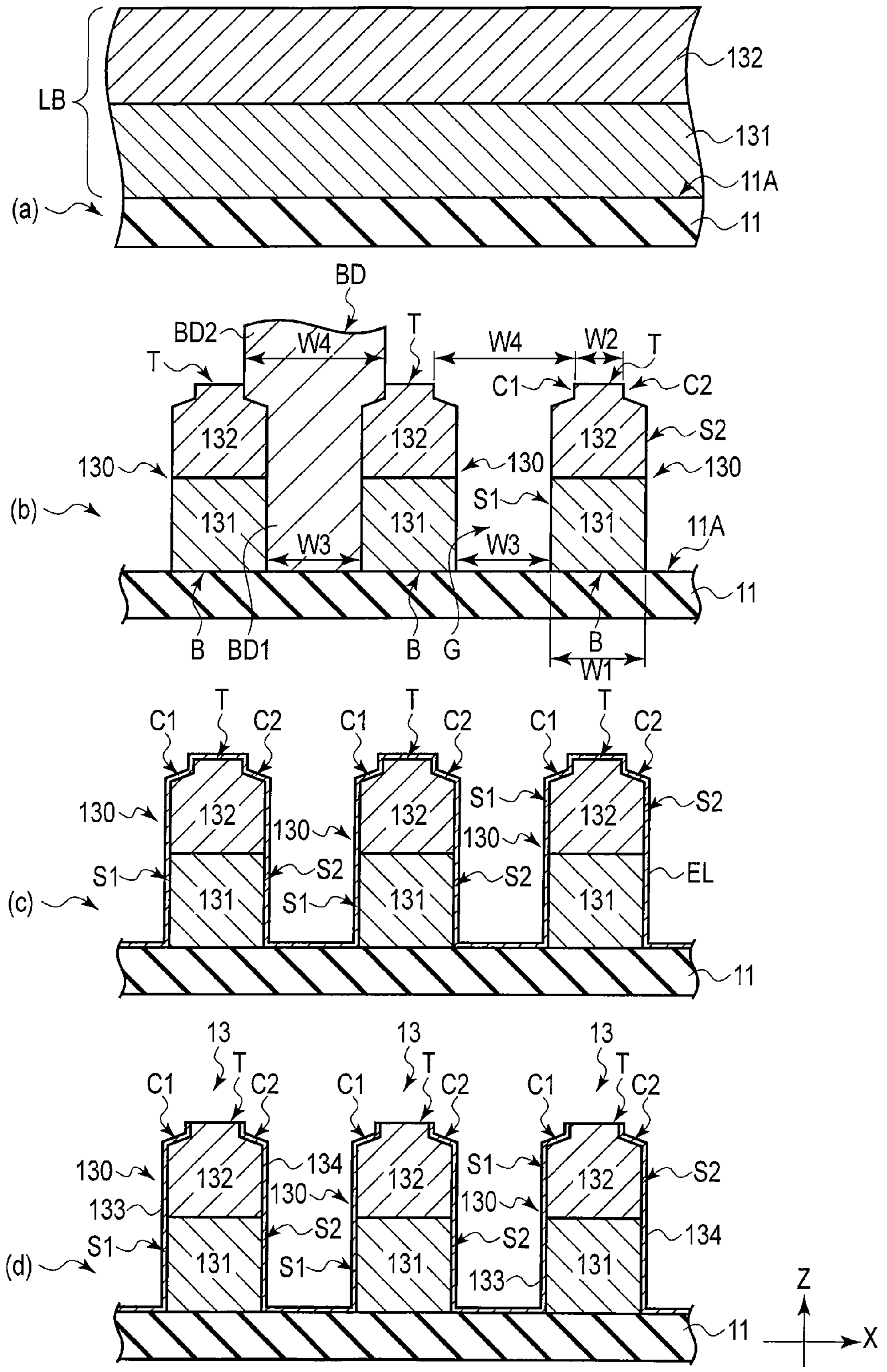
FIG. 7 is a cross-sectional view which schematically shows a part of a manufacturing process of the ink-jet head of the embodiment.

FIG. 7 is a cross-sectional view which schematically shows a part of a manufacturing process of the ink-jet head 1 of the embodiment. The description below is given with reference to cross sections in the X-Z plane.

To start with, as shown in part (a) of FIG. 7, a multilayer body LB of a first piezoelectric member 131 and a second piezoelectric member 132, each having a strip shape extending in the X direction, is formed on the top surface 11A of the insulative substrate 11. The multilayer body LB is formed by forming the first piezoelectric member 131 and then stacking the second piezoelectric member 132 on the first piezoelectric member 131. At this time, the polarization direction of the first piezoelectric member 131 and the polarization direction of the second piezoelectric member 132 are set to be opposite to each other. In the meantime, the multilayer body LB of the first piezoelectric member 131 and second piezoelectric member 132 is formed in two rows on the top surface 11A of the insulative substrate 11.

Then, as shown in part (b) of FIG. 7, the multilayer body LB of the first piezoelectric member 131 and second piezoelectric member 132 is cut by a blade BD, and grooves G are formed. At this time, the blade BD cuts the multilayer body LB, while moving in the Y' direction crossing the X direction, relative to the multilayer body LB. Specifically, the blade BD forms the grooves G extending in the Y' direction.

This cutting step is performed by making use of, for example, a slicer or a dicer. The blade BD is, for instance, a diamond blade. The blade BD includes a distal end portion BD1 having a width substantially equal to the third width W3 of the groove G, and a large-width portion BD2 having a width substantially equal to the fourth width W4 of the groove G. The length of the distal end portion BD1 in the Z direction is less than the length of the multilayer body LB in the Z direction. Thus, when the blade BL cuts the multilayer body LB, the distal end portion BD1 cuts a part of the first piezoelectric member 131 and a part of the second piezoelectric member 132, thereby exposing the top surface 11A of the insulative substrate 11 and forming the first side surface S1 and second side surface S2 of the partition wall 130. On the other hand, the large-width portion BD2 cuts a part of the second piezoelectric member 132, thereby forming the first recess portion C1 and second recess portion C2.

Thus, a partition wall 130, which includes a bottom surface B with the first width W1, the top surface T with the second width W2, the first side surface S1 and second side surface S2, and the first recess portion C1 and second recess portion C2, is formed. In other words, the groove G, which has the third width W3 between the bottom surfaces B of the neighboring partition walls 130, and the fourth width W4 between the top surfaces T of the neighboring partition walls 130, is formed.

Subsequently, as shown in part (c) of FIG. 7, an electrode EL is formed on the top surface 11A of the insulative substrate 11 and on the surfaces of the first piezoelectric member 131 and second piezoelectric member 132 which constitute the partition wall 130. Specifically, the electrode EL covers the first side surface S1 and second side surface S2 of the partition wall 130, the first recess portion C1 and second recess portion C2, and the top surface T. The electrode EL is formed by, for example, plating.

Then, as shown in part (d) of FIG. 7, the electrode EL, which is formed on the top surface T of the partition wall 130 (i.e. the top surface of the second piezoelectric member 132), is removed. The electrode EL is removed by a method such as polishing or laser irradiation. The two electrodes, which sandwich the partition wall 130, are electrically insulated. Thereby, an actuator 13 is formed, which includes the partition wall 130 comprising the first piezoelectric member 131 and second piezoelectric member 132, the first electrode 133 covering the first side surface S1 of the partition wall 130 and the first recess portion C1, and the second electrode 134 covering the second side surface S2 and second recess portion C2.

Figure 8:
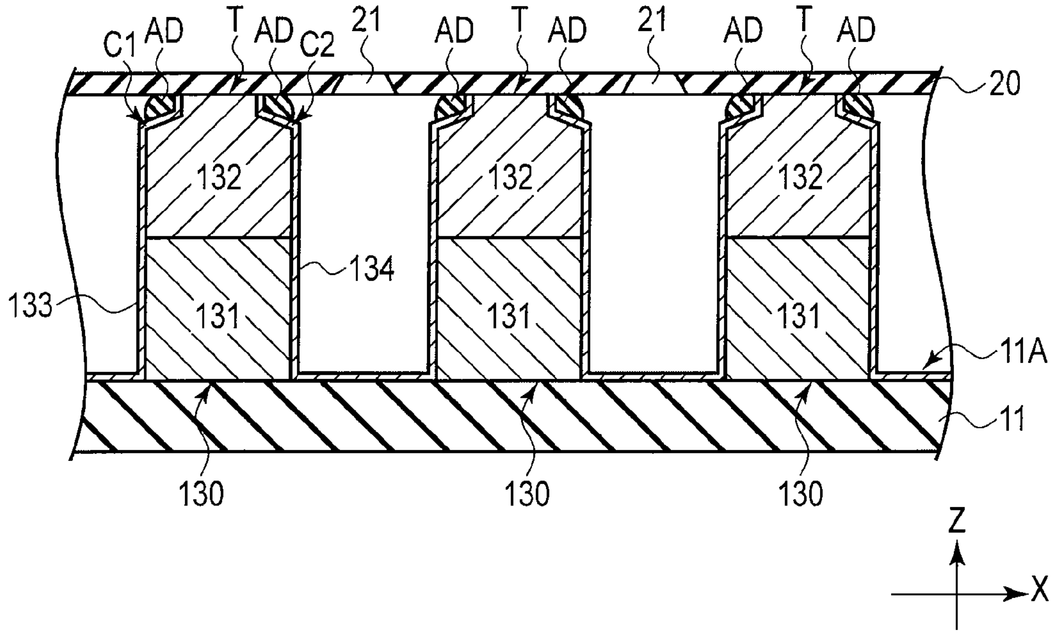
FIG. 8 is a cross-sectional view which schematically shows a part of the manufacturing process of the ink-jet head of the embodiment, FIG. 8 being a view for describing an adhesion step of a nozzle plate.

FIG. 8 is a cross-sectional view which schematically shows a part of the manufacturing process of the ink-jet head 1 of the embodiment, FIG. 8 being a view for describing an adhesion step of the nozzle plate 20.

After the actuator 13 is formed on the top surface 11A of the insulative substrate 11, the second piezoelectric member 132 of the partition wall 130 and the nozzle plate 20 are attached by an adhesive. The adhesive is, for example, an epoxy resin. The adhesive is coated on the top surface T of the partition wall 130. Use is made of the nozzle plate 20 which is configured such that a fluorine coating is applied to the surface of a polyimide film.

In the example illustrated, use is made of the nozzle plate 20 in which nozzle holes 21 are formed in advance prior to the adhesion. As the method of forming the nozzle holes 21 in the nozzle plate 20 in advance, use is made of, for example, a laser process of irradiating a laser beam, a pressing process, or electroforming. The nozzle plate 20 is positioned such that the nozzle hole 21 is located at a substantially middle point between neighboring partition walls 130, and then the nozzle plate 20 is attached to the partition wall 130 by a process of curing the adhesive.

At this time, an adhesive AD, which protrudes from between the nozzle plate 20 and partition wall 130, is received on the first electrode 133 covering the first recess portion C1 and on the second electrode 134 covering the second recess portion C2.

Therefore, according to the manufacturing method including the adhesion step of the nozzle plate 20, the flow of the adhesive AD into the nozzle hole 21 can be prevented.

Figure 9:
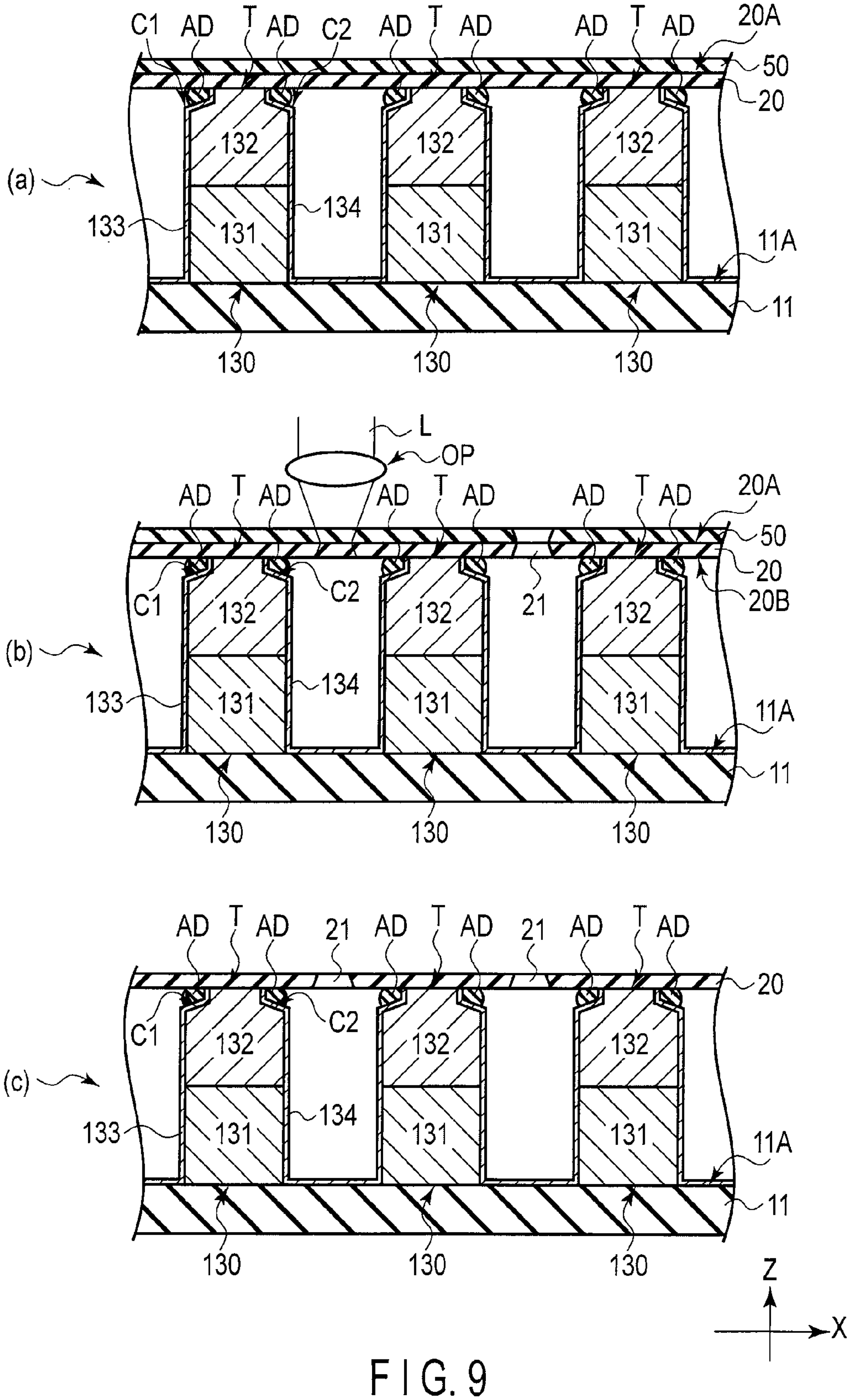
FIG. 9 is a cross-sectional view which schematically shows a part of the manufacturing process of the ink-jet head of the embodiment, FIG. 9 being a view for describing another adhesion step of the nozzle plate.

FIG. 9 is a cross-sectional view which schematically shows a part of the manufacturing process of the ink-jet head 1 of the embodiment, FIG. 9 being a view for describing another adhesion step of the nozzle plate 20.

To start with, as shown in part (a) of FIG. 9, after the actuator 13 is formed on the top plate 11A of the insulative substrate 11, the second piezoelectric member 132 of the partition wall 130 and the nozzle plate 20 are attached by an adhesive. The example illustrated in FIG. 9 differs from the example shown in FIG. 8 in that nozzle holes 21 are not formed in advance in the nozzle plate 20 prior to the adhesion.

Use is made of the nozzle plate 20 which is configured such that a fluorine coating is applied to the surface of a polyimide film. This nozzle plate 20 is the same member as in the example shown in FIG. 8, but includes a protection film 50 which is attached to the top surface 20A of the nozzle plate 20. The protection film 50 is configured such that an adhesive is applied to a polyethylene terephthalate (PET) film. As examples of the thickness thereof, the thickness of the nozzle plate 20 is about 50 μm, and the thickness of the protection film 50 is about 15 μm.

The nozzle plate 20 including the protection film 50 is placed on the top surface T of the partition wall 130 on which the adhesive is coated, in the state in which the back surface 20B of the nozzle plate 20 is directed to the partition wall 30. By a process of curing the adhesive, the nozzle plate 20 is attached to the partition wall 130. At this time, since the nozzle plate 20 has no nozzle hole 21, precise alignment as in the example shown in FIG. 8 is needless.

An adhesive AD, which protrudes from between the nozzle plate 20 and the partition wall 130, is received on the first electrode 133 that covers the first recess portion C1, and on the second electrode 134 that covers the second recess portion C2.

Subsequently, as shown in part (b) of FIG. 9, a laser beam L is radiated on the nozzle plate 20, thereby forming nozzle holes 21. An optical system OP guides the laser beam L to a substantially middle point between neighboring partition walls 130, focuses the laser beam L near the top surface 20A of the nozzle plate 20, and then diffuses the laser beam L from the top surface 20A toward the back surface 20B of the nozzle plate 20. The laser beam L forms such a nozzle hole 21 that the outer diameter of the top surface 20A is less than the inner diameter of the back surface 20B.

Then, as shown in part (c) of FIG. 9, the protection film 50 is peeled from the top surface 20A of the nozzle plate 20.

Therefore, according to the manufacturing method including the adhesion step of the nozzle plate 20, the flow of the adhesive AD into the nozzle hole 21 can be prevented. Moreover, the precision of alignment between the nozzle plate 20 and partition wall 130 can be relaxed.

Figure 10:
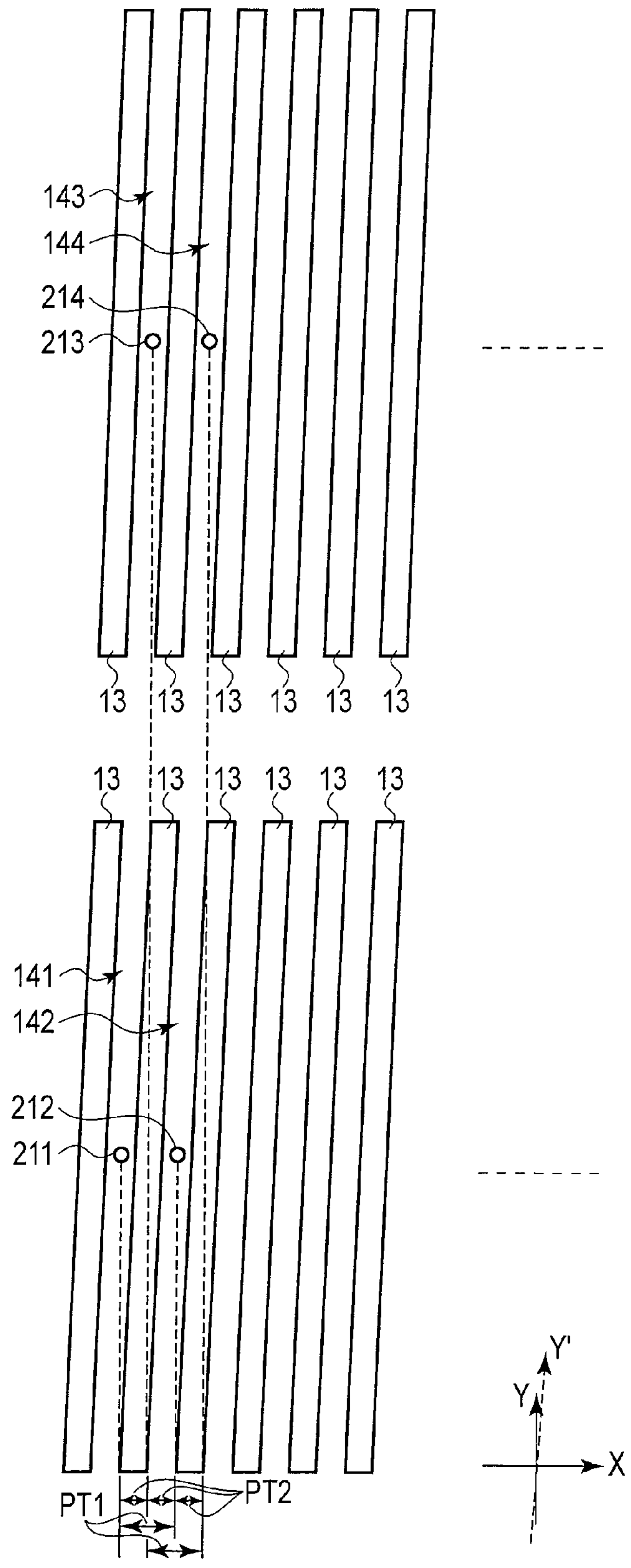
FIG. 10 is a schematic plan view of the ink-jet head which has been manufactured by the manufacturing method of the embodiment.

FIG. 10 is a schematic plan view of the ink-jet head 1 which has been manufactured by the manufacturing method of the embodiment.

An upper part and a lower part of FIG. 10 illustrate actuators 13 which are arranged in the X direction. Neighboring actuators 13 form ink pressure chambers 14 therebetween. To be more specific, a first ink pressure chamber 141 and a second pressure chamber 142 in the lower part of FIG. 10 are arranged in the X direction. A third ink pressure chamber 143 and a fourth pressure chamber 144 in the upper part of FIG. 10 are arranged in the X direction. Each of the first ink pressure chamber 141, second pressure chamber 142, third ink pressure chamber 143 and fourth pressure chamber 144 extends in the Y' direction which crosses the X direction at an acute angle of less than 90°. In short, the Y' direction is not perpendicular to the X direction.

The first ink pressure chamber 141 and third ink pressure chamber 143 are located on the same straight line along the Y' direction. The second ink pressure chamber 142 and fourth ink pressure chamber 144 are located on the same straight line along the Y' direction. The ink pressure chambers 14 having this positional relationship can be formed by the above-described manufacturing method. Specifically, in the above-described manufacturing method, the multilayer body LB of the first piezoelectric member and second piezoelectric member, each having a strip shape extending in the X direction, is formed in two rows, and the two rows of the multilayer body LB are cut by the blade BD in the Y' direction.

A pitch PT1 in the X direction between a first nozzle hole 211, which communicates with the first ink pressure chamber 141, and a second nozzle hole 212, which communicates with the second ink pressure chamber 142, is equal to a pitch PT1 in the X direction between a third nozzle hole 213, which communicates with the third ink pressure chamber 143, and a fourth nozzle hole 214, which communicates with the fourth ink pressure chamber 144.

A pitch PT2 in the X direction between the first nozzle hole 211 and third nozzle hole 213, a pitch PT2 in the X direction between the third nozzle hole 213 and second nozzle hole 212, and a pitch PT2 in the X direction between the second nozzle hole 212 and fourth nozzle hole 214 are equal. The pitch PT2 is ½ of the pitch PT1.

For example, when the pitch PT1 is about 80 μm, printing with a resolution of 300 dpi can be performed by the two rows of ink pressure chambers 14. In addition, when the pitch PT1 is about 40 μm, printing with a resolution of 600 dpi can be performed by the two rows of ink pressure chambers 14.

As has been described above, according to the present embodiment, it is possible to provide the ink-jet head which can realize high fineness and can perform printing with high quality, and the method of manufacturing the ink-jet head.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An ink-jet head comprising:

an insulative substrate;

a nozzle plate opposed to the insulative substrate;

a partition wall disposed between the insulative substrate and the nozzle plate, and comprising:

a bottom surface having a first width which is in contact with the insulative substrate, a top surface having a second width less than the first width, which is in contact with the nozzle plate, wherein the bottom surface and the top surface are on opposite sides of the partition wall, a side surface which is substantially perpendicular to the bottom surface, and a recess portion which connects the side surface and the top surface;

an adhesive which attaches the partition wall to the nozzle plate; and an electrode which covers the side surface and the recess portion, and contacts a part of the adhesive.

2. The ink-jet head of claim 1, wherein an edge of the top surface, which is continuous with the recess portion, is located closer to a center of the partition wall than the side surface.

3. The ink-jet head of claim 1, wherein the partition wall comprises a first flat surface which is continuous with the top surface, and a second flat surface which connects the first flat surface and the side surface, the first flat surface and the second flat surface defining the recess portion.

4. The ink-jet head of claim 1, wherein the partition wall comprises a single flat surface which connects the top surface and the side surface, the single flat surface defining the recess portion.

5. The ink-jet head of claim 1, wherein the partition wall comprises a curved surface which connects the top surface and the side surface, the curved surface defining the recess portion.

* * * * *